(12) United States Patent
Wurzer et al.

(10) Patent No.: US 11,682,437 B2
(45) Date of Patent: Jun. 20, 2023

(54) PHASE INTERPOLATOR FOR MODE TRANSITIONS

(71) Applicant: Micron Technology, Inc., Boise, ID (US)

(72) Inventors: Steven G. Wurzer, Blaine, MN (US); Jeremy Kuehlwein, Woodbury, MN (US); Michael J. O'Brien

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 17/462,167

(22) Filed: Aug. 31, 2021

(65) Prior Publication Data

US 2023/0069329 A1    Mar. 2, 2023

(51) Int. Cl.
| | |
|---|---|
| *H03K 5/05* | (2006.01) |
| *H03K 5/003* | (2006.01) |
| *H03K 5/01* | (2006.01) |
| *G11C 7/22* | (2006.01) |
| *G11C 7/10* | (2006.01) |

(52) U.S. Cl.
CPC ............ *G11C 7/222* (2013.01); *G11C 7/1066* (2013.01); *H03K 5/003* (2013.01); *H03K 5/01* (2013.01); *H03K 5/05* (2013.01); *G11C 7/225* (2013.01)

(58) Field of Classification Search
CPC ............ H03K 5/003; H03K 5/01; H03K 5/05; H03K 21/02; H03K 21/023; H03K 21/026; H03K 21/08; H03K 21/10; H03K 21/16–17; H03K 2005/00013; H03K 2005/00019; H03K 2005/00052
See application file for complete search history.

(56) References Cited

U.S. PATENT DOCUMENTS

| | | | |
|---|---|---|---|
| 6,727,741 B2 | 4/2004 | Huang | |
| 8,253,454 B2 | 8/2012 | Lin | |
| 9,608,611 B1* | 3/2017 | Hearne | H03K 5/135 |
| 9,698,970 B1* | 7/2017 | Cho | H03K 5/135 |
| 9,876,489 B1* | 1/2018 | Casey | H03K 5/05 |
| 10,153,775 B1* | 12/2018 | Wurzer | H03L 7/0998 |
| 10,425,090 B2* | 9/2019 | Wurzer | H03L 7/0998 |
| 10,840,924 B2* | 11/2020 | Wurzer | H03L 7/0998 |
| 11,368,143 B1* | 6/2022 | Chakraborty | H03K 5/01 |
| 2013/0088274 A1* | 4/2013 | Gu | H03K 5/131 327/231 |
| 2022/0286119 A1* | 9/2022 | Lloyd | H03K 5/01 |

* cited by examiner

*Primary Examiner* — Jason Crawford
(74) *Attorney, Agent, or Firm* — Brooks, Cameron & Huebsch, PLLC (57) ABSTRACT

A system includes a mixer of a phase interpolator. The mixer includes a dynamic load whose output signal is coupled to a subsequent stage of the phase interpolator. The dynamic load is configured to provide an alternating current (AC) signal to the subsequent stage of the phase interpolator as input clock signals. The mixer further includes a static load whose output signal is coupled to the subsequent stage of the phase interpolator in parallel with the respective output signal line of the dynamic load. The static load configured to provide a direct current (DC) signal to the phase interpolator temporarily in replacement of the respective AC signals to prevent output signals of the subsequent stage of the phase interpolator from being unpredictable.

20 Claims, 7 Drawing Sheets

PHASE INTERPOLATOR FOR MODE TRANSITIONS

TECHNICAL FIELD

Embodiments of the disclosure relate generally to electronic systems, and more specifically, relate to phase interpolator circuits for mode transitions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to phase interpolator circuits for mode transitions (e.g., between direct current (DC) mode and alternating current (AC) mode). As an example, embodiments can be used within memory sub-systems. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

Digital and mixed digital-analog circuits often operate based on timing clocks. These timing clocks may be generated using a clock generator such as a phase interpolator and associated control and/or signal shaping circuitry. The characteristics of timing clocks provided to electronic system components can affect various system parameters. For example, in memory systems, parameters such as memory interface bandwidth can depend on characteristics such as clock frequency.

A phase interpolator can include a mixer that generates internal sampling clocks. In generating the internal sampling clocks, the mixer can utilize either one of two types of current loads that is configured to either output alternating current (AC) signal(s) or direct current (DC) signal(s). Operating in an AC mode (e.g., with a dynamic current load configured to output AC signals) can provide benefits such as reducing a duty cycle distortion and/or integral nonlinearity (INL) errors via a common mode feedback control loop. On the other hand, such a feedback control loop can be incompatible with static operation of the phase interpolator (e.g., operating in a DC mode) since the loop forms a high pass function from the phase interpolator mixer input to the output, which can leave the output undetermined since the input clocks are not actively toggling. Assuming a phase interpolator can operate in both a DC mode and an AC mode, glitching at the phase interpolator output can occur in association with transitioning between the DC mode (static load) and an AC mode (dynamic load). Glitching at the phase interpolator output can create negative effects (e.g., unpredictability) in downstream logic such as current mode logic (CML).

Aspects of the present disclosure address the above and other deficiencies by providing a phase interpolator having both static loads (e.g., a current load configured to output DC signals) and dynamic loads (e.g., current load configured to output AC signals). In order to avoid glitching at the output, the mixers consistent with the disclosure can initially operate with a static load, which can prevent signals from subsequent stages/components of the phase interpolator from behaving in an unpredictable manner. The mixer can subsequently transition to operating with the dynamic load. During the transition to dynamic mode operation, the mixer can operate with both the static loads and the dynamic loads until output signals of the dynamic load becomes stabilized and/or input signals to the dynamic load has reached a particular/threshold value. The transition can be performed at a controlled (e.g., gradual) rate so as to avoid glitching. Once the output signals of the dynamic load is stabilized, the static load can be disabled to take advantage of the reduced duty cycle distortion and/or INL errors associated with the dynamic load.

Figure 1:
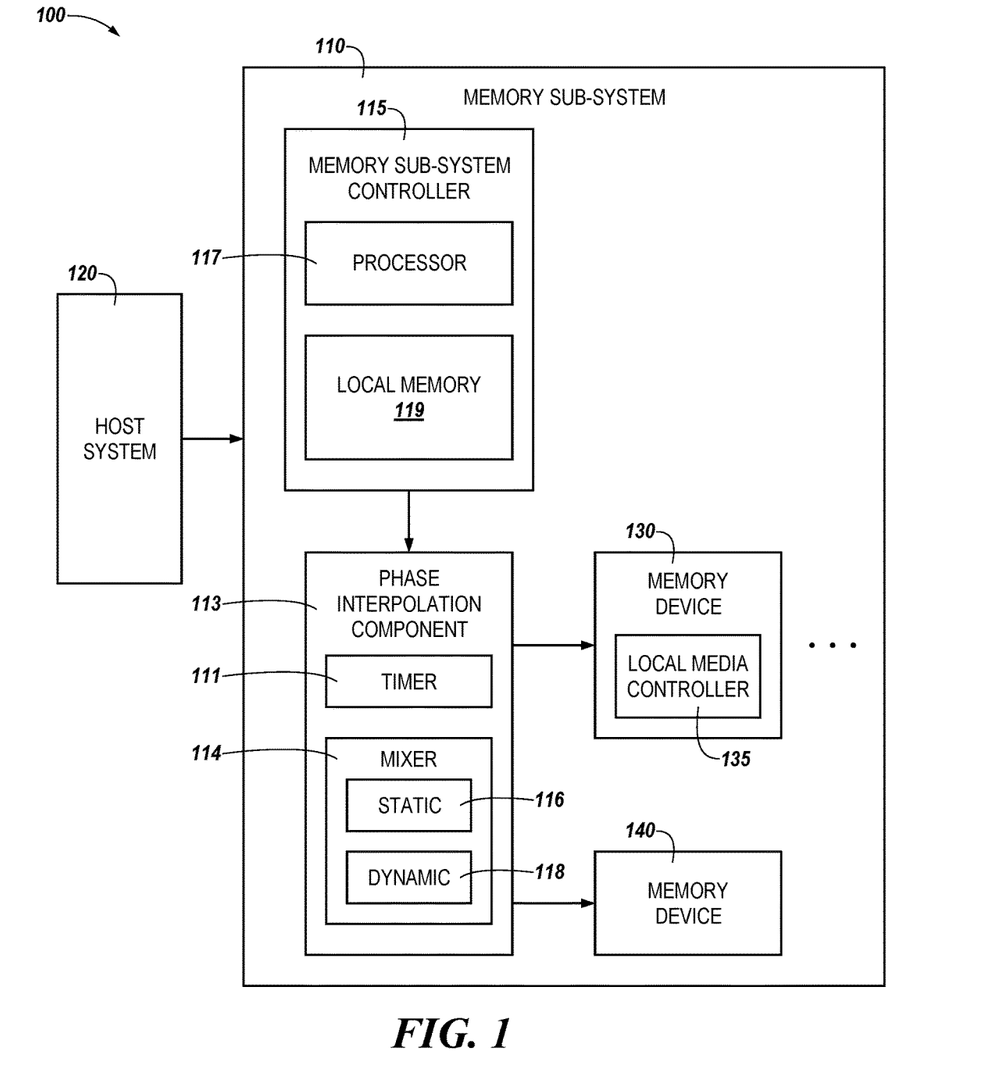
FIG. 1 illustrates an example computing system that includes a phase interpolator component in accordance with some embodiments of the present disclosure.

FIG. 1 illustrates an example computing system 100 that includes a phase interpolator component 113 in accordance with some embodiments of the present disclosure. In this example, the phase interpolator component 113 is within a memory sub-system 110; however, embodiments are not so limited. For example, phase interpolator components described herein may be used within various other types of electronic systems and/or circuits. As shown in FIG. 1, the memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

As shown in FIG. 1, the memory sub-system 110 can include a phase interpolation component 113 (e.g., phase interpolator) in accordance with embodiments of the present disclosure. The phase interpolation component 113 can include a mixer 114 and timing circuitry 111. Although not shown in FIG. 1 so as to not obfuscate the drawings, the phase interpolation component 113 and/or mixer 114 can include various circuitry to facilitate and/or orchestrate the operations described herein.

The mixer 114 can be configured to generate internal sampling clocks (e.g., clock signals) based on a master clock and/or reference clock received, for example, from the host 120 and provide the generated sampling clocks to other components and/or subsequent stages of the phase interpolation component 113, such as current mode logic (CML)-style circuit and/or state machines including buffers (CML buffers), dividers, flip flops, etc. Although embodiments are not so limited, the internal sampling clocks generated at the mixer 112 can be multiple differential clock signals that are out of phase with each other. For instance, two differential clocks may be 180° out of phase.

In response to receipt of the sampling clocks from the mixer 114, the subsequent stages of the phase interpolation component 113 can adjust the phase of the sampling clock(s) into fine increments and/or further generate secondary clocks based on the received sampling clocks. For example, a divider (e.g., a frequency divider) of the phase interpolation component 113 can further generate quadrature clock signals that are 90° out of phase with each other in each quadrant based on the differential clock signals received from the mixer 114. Although embodiments are not so limited, the phase interpolator 120 may have a granularity of 512 steps per each clock phase (e.g., 512 steps from a first rising edge of a clock cycle to a second rising edge of the clock cycle). For example, a first clock signal of the quadrant clock signals can start rising at a step 0, a second clock signal of the quadrant clock signals can start rising at a step 128, a third clock signal of the quadrant clock signals can start rising at a step 256, and a fourth clock signal of the quadrant clock signals can start rising at a step 384. The quadrature clock signals generated at the phase interpolation component 113 can operate in a wideband frequency range (e.g., 2.5 gigahertz (GHz) to 5 GHz) to meet high bandwidth requirements of state-of-the-art circuits and systems such as DDR memory subsystems.

The mixer 114 can include current loads, such as a static load 116 and a dynamic load 118 as illustrated in FIG. 1. The mixer 114 can operate in various operation modes. For example, in a first operation mode (e.g., DC mode), the mixer 114 can operate only with the static load 116 and, in a second operation mode (e.g., AC mode), the mixer 114 can operate only with the dynamic load 118. The mixer 114 can transition/switch among those operation modes at a controlled rate so as not to introduce glitching at the output. As an example, the mixer 114 can initially operate in the first operation mode, such as only with the static load 114. At a later point, the dynamic load 118 is enabled and the statice load is disabled at respective controlled rates so as to operate in the second operation mode, such as only with the dynamic load 118.

The phase interpolation 113 can further include a timer 111, which can be utilized to determine the timing associated with enabling/disabling the loads 116 and 118. Further details of how to operate the mixer 114 in and/or transition (and/or switch) among those operation modes are described in connection with FIGS. 2-5.

In some embodiments, the memory sub-system controller 115 includes at least a portion of the phase interpolation component 113. For example, the memory sub-system controller 115 can include a processor 117 (processing device) configured to execute instructions stored in local memory 119 for performing the operations described herein. In some embodiments, the phase interpolation component 113 is part of the host system 120, an application, or an operating system.

In a non-limiting example, a mixer (e.g., the mixer 114) of a phase interpolator (e.g., the phase interpolation component 113) can include a dynamic load (e.g., the dynamic load 118) having an output signal provided to a subsequent stage (e.g., state machines, such as dividers) of the phase interpolator. The dynamic load is configured to provide an AC signal to the subsequent stage of the phase interpolator as an input clock signal. The mixer can further include a static load (e.g., the static load 116) having an output signal provided to the subsequent stage of the phase interpolator in parallel with the respective output signal of the dynamic load, the static load configured to provide a DC signal to the phase interpolator temporarily in replacement of the respective AC signals to prevent output signals of the subsequent stage of the phase interpolator from being unpredictable. In some embodiments, the dynamic load is a source follower load, the source follower load further comprising a n-type metal oxide semiconductor (nMOS) transistor. In some embodiments, the static load is a resistive load, the resistive load further comprising a p-type metal oxide semiconductor (pMOS) transistor.

The mixer 114 can include a pair of dynamic loads (e.g., dynamic loads 218/418 illustrated in FIG. 2 and FIG. 4, respectively) that are coupled to the subsequent stage of the phase interpolator. The mixer 114 can further include a pair of static loads (e.g., static loads 216/416 illustrated in FIG. 2 and FIG. 4, respectively) that are coupled to the subsequent stage of the phase interpolator in parallel with the pair of dynamic loads.

Continuing with this example, the dynamic loads and the static loads can be coupled to the subsequent stage of the phase interpolator via a pair of complementary signal lines. Further, the static loads can include a pair of resistive loads that are coupled to a power supply signal via a common mode resistor (e.g., the common mode resistor 443 illustrated in FIG. 4).

In another non-limiting example, a system (e.g., the computing system 100) can include a mixer (e.g., the mixer 114) of a phase interpolator (e.g., the phase interpolation component 113) that is coupled to a subsequent stage (e.g., state machines, such as dividers) of the phase interpolator. The mixer 114 can include a static load (e.g., the static load 116) configured to output a DC signal and a dynamic load (e.g., the dynamic load 118) configured to output an AC signal. The system can further include a processing device (e.g., the processor 117). The processing device can be configured to cause the mixer to enable the static load to provide a DC signal to the subsequent stage of the phase interpolator. The processing device can be further configured to cause the mixer to ramp up (e.g., increase) an input signal provided to the dynamic load to cause the dynamic load to output an AC signal, while the DC signal is being provided to the phase interpolator. The processing device can be further configured to cause the mixer to gradually adjust a voltage level of an input signal provided to the static load to disable the static load subsequent to a voltage level of the input signal being provided to the dynamic load reaching a particular value.

In some embodiments, the subsequent stage of the phase interpolator can include a plurality of dividers. In this example, the processing resource is configured to cause the phase interpolator to reset the plurality of dividers while the static load is enabled.

In some embodiments, the static load can include a source follower load. The source follower load can be disabled as the input signal provided to the dynamic load ramps up. In some embodiments, the static load can include a resistive load. In this example, the processing device is configured to ramp up an input signal (e.g., a bias voltage of the resistive loads 418 and/or the signal 554 illustrated in FIG. 5) being supplied to the resistive load. Further, in this example, the resistive load can be disabled as the input signal provided to the resistive load ramps up. Further, in this example where the static load is a resistive load, the input signal provided to the resistive load can be a gate voltage applied to a transistor of the resistive load.

Figure 2:
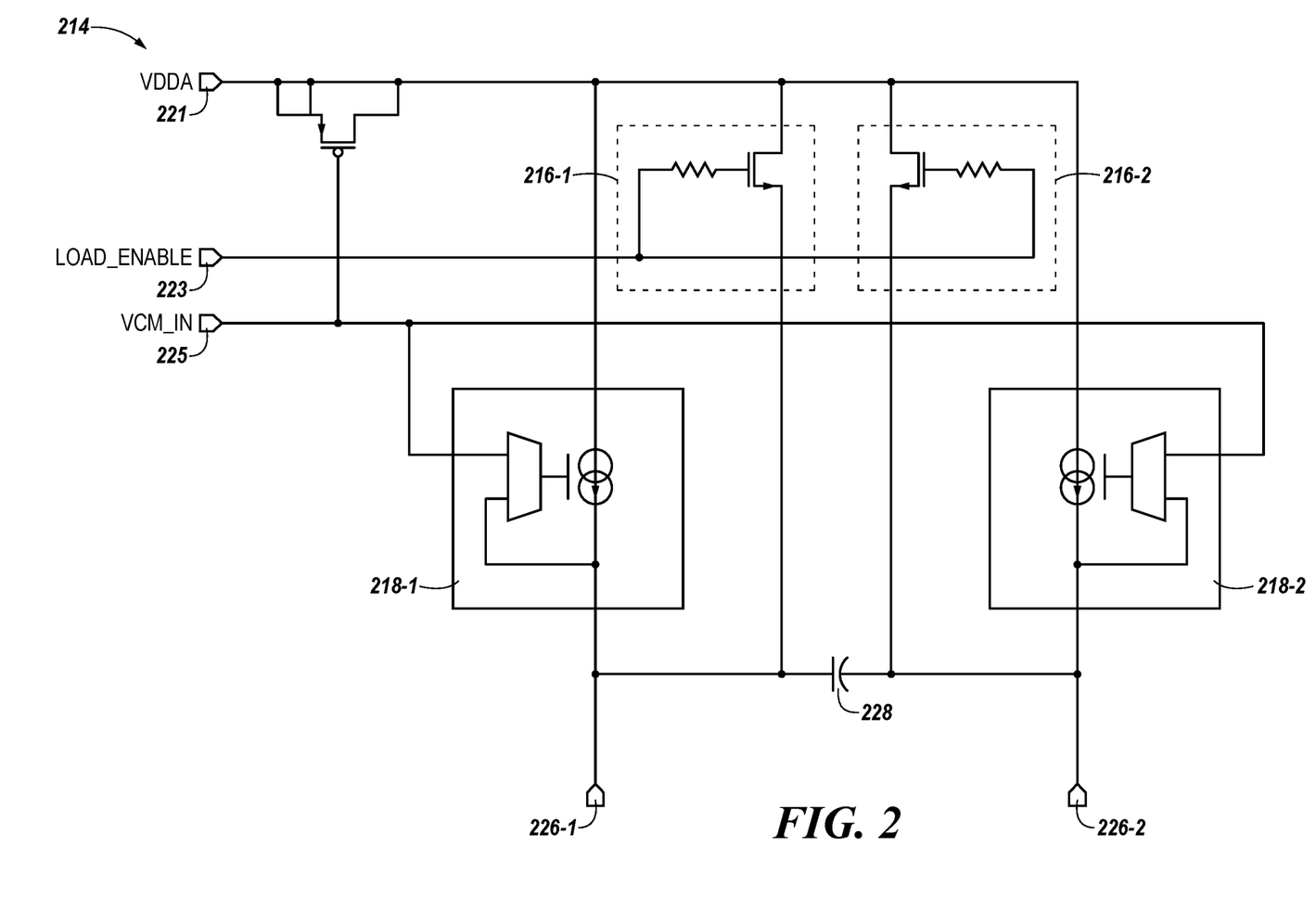
FIG. 2 illustrates an example mixer of a phase interpolator that includes static loads and dynamic loads in accordance with some embodiments of the present disclosure.

In some embodiments, the mixer can be coupled to the subsequent stage of the phase interpolator via a pair of complementary signal lines (e.g., the pair of complementary signal lines 226 illustrated in FIG. 2). The pair of complementary signal lines are coupled to one another via a capacitor (e.g., the capacitor 228 illustrated in FIG. 2). In some embodiments, the processing device can be configured to indicate that a voltage level of the input signal has reached the particular value and the output signal of the dynamic load has entered the steady state (e.g., has been stabilized) based on a timer.

In some embodiments, the subsequent stage of the phase interpolator can include a divider. In this example, the mixer can be configured to provide a pair of differential clock signals and the divider can be configured to generate quadrature clock signals based on the pair of differential clock signals received from the mixer.

FIG. 2 illustrates an example mixer 214 of a phase interpolator (e.g., the phase interpolation component 113 illustrated in FIG. 1) that includes static loads 216-1 and 216-2 (collectively referred to as static loads 216) and dynamic loads 218-1 and 218-2 (collectively referred to as dynamic loads 218) in accordance with some embodiments of the present disclosure. The example mixer 214, the static loads 216, and the dynamic loads 218 shown in FIG. 2 can correspond to the mixer 114, the static load 116, and the dynamic load 118 illustrated in connection with FIG. 1, respectively. In some embodiments, the static loads 216 illustrated in FIG. 2 can be source follower loads.

As illustrated in FIG. 2, the static loads 216 can respectively include a resistor and a transistor. The respective resistors of the static loads 216 can be a gate resistor and can each be an adjustable (e.g., adaptable and/or variable) resistor. Although embodiments are not so limited, a transistor of each one of the static loads 216 can be a nMOS transistor. The dynamic loads 218 can respectively include an amplifier (e.g., operational transconductance amplifier) and an independent current source (e.g., generator).

As illustrated in FIG. 2, the static loads 216 and the dynamic loads 218 are coupled to a power supply signal line 221 such that, during operation of the mixer 214, the static loads 216 and the dynamic loads 218 are configured to receive a power supply signal ("VDDA") via the power supply signal line 221. The static loads 216 are respectively coupled to a signal line 223 to receive an enable signal ("LOAD_ENABLE") that enables the static loads 216 and/or a disable signal that disables the static loads 216. The dynamic loads 218 are respectively coupled to a signal line 225 to receive a master clock signal ("VCM_IN") (e.g., from the memory sub-system controller 115 and/or the host system 120 illustrated in FIG. 1). As further described herein, the signal lines 223 and 225 can be used to enable/disable static loads 216 and/or dynamic loads 218, respectively.

As further illustrated in FIG. 2, respective output signal lines of the static loads 216 are coupled to a pair of complementary signal lines 226-1 and 226-2 (collectively referred to as a pair of complementary signal lines 226) in parallel with respective output signal lines of the dynamic loads 218. The pair of complementary signal lines 226 are coupled to one another via a capacitor 228 and to a subsequent stage of a phase interpolator (e.g., the phase interpolation component 113 illustrated in FIG. 1), such as current mode logic (CML)-style circuit and/or state machines including buffers (CML buffers), dividers, flip flops, etc.

Figure 3:
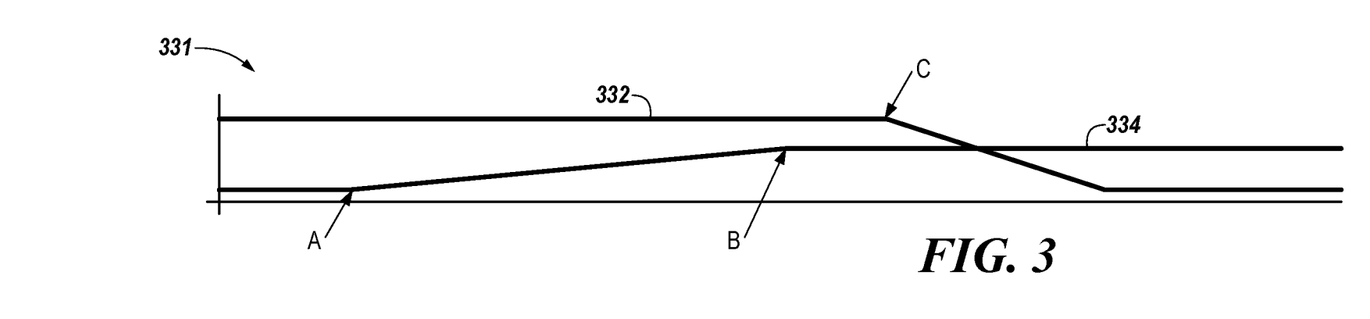
FIG. 3 is a graph illustrating changes in voltage levels of respective input voltages to static loads and dynamic loads of a mixer in accordance with some embodiments of the present disclosure.

FIG. 3 is a graph 331 illustrating changes in voltage levels of respective input voltages to static loads (e.g., the static loads 216 illustrated in FIG. 2) and dynamic loads (e.g., the dynamic loads 218 illustrated in FIG. 2) of a mixer (e.g., the mixer 214 illustrated in FIG. 2) in accordance with some embodiments of the present disclosure. A signal 332 can correspond to a bias voltage applied to the static loads 216 via the signal line 223 and a signal 334 can correspond to a signal applied to the dynamic loads 218 via the signal line 225 illustrated in FIG. 2.

The mixer 214 can be operated in a first operation mode, in which the mixer 214 is operated only with the static loads 216. To operate the mixer 214 in the first operation mode, the static loads 216 can be enabled by applying a VDDA (e.g., corresponding to a voltage level of the signal 332 up to a point C illustrated in FIG. 5) to a gate of respective transistors of the static loads 216 and the dynamic loads 218 can be disabled by applying a signal corresponding to VSSA (e.g., ground voltage), which leaves only the static loads 216 active in the mixer 214 and cause the mixer 214 to behave as a buffer. The enabled static loads 216 output DC signals.

During the first operation mode, the mixer 214 outputs respective complementary signals having static (e.g., constant) voltage levels. For example, during the first operation mode, a signal coupled to one of the pair of complementary signals 226 can be driven low (e.g., set to "1") and a signal coupled to another one of the pair of complementary signals 226 can be driven high (e.g., set to "0"). In some embodiments, various components of a phase interpolator (e.g., the phase interpolation component 113 illustrated in FIG. 1), such as dividers, can be reset during the first operation mode.

Subsequently, the mixer 214 that has been operated in the first operation mode can be transitioned to operate in a second operation mode, in which the mixer 214 operates only with the dynamic loads 218. To transition operation of the mixer 214 from the first operation mode to the second operation mode, the signal 334 can be ramped up at a controlled rate to enable the dynamic loads 218, as shown from a point A to a point B illustrated in FIG. 3. By way of example, the signal 334 can be ramped up approximately from 0 volt (V) to 0.6 V over 200 nanoseconds (ns).

As illustrated herein, the enabled dynamic loads 218 output AC signals. The ramped-up signal 334 can cause a voltage level of the AC signals output from the dynamic loads 218 to rise/increase, which can further disable the static loads 216. The signal 334 can be ramped up to a particular voltage level (e.g., a voltage level of the signal 334 subsequent to the point B illustrated in FIG. 3) and can remain constant (e.g., stabilized) thereafter. Once a voltage level of the signal 334 is stabilized, such as at a point C illustrated in FIG. 3, the signal 332 can be ramped down (e.g., decrease) to VSSA (e.g., ground voltage) at a controlled rate to disable the static loads 216, which reduces/eliminates leakage through the static loads 216. By way of example, the signal 332 can be ramped down approximately from 1.1 V to 0 V over 100 ns.

During the second operation mode, the mixer 214 can output internal sampling clock signals via the pair of complementary signal lines 226. As described herein, the internal sample clock signals can further be adjusted into fine increments and/or used to generate, for example, quadrature clock signals at a subsequent stage (e.g., state machine such as a divider) of the phase interpolator.

A timer can be used to determine when to start disabling/ramping down the signal 332 (e.g., at point C illustrated in FIG. 3). For example, a timer can be initiated when the first operation mode is entered and the signal 332 can start ramping down when the timer indicates that the particular time period has passed. The time period can be sufficient to allow the ramping up signal 334 to stabilize.

Figure 4:
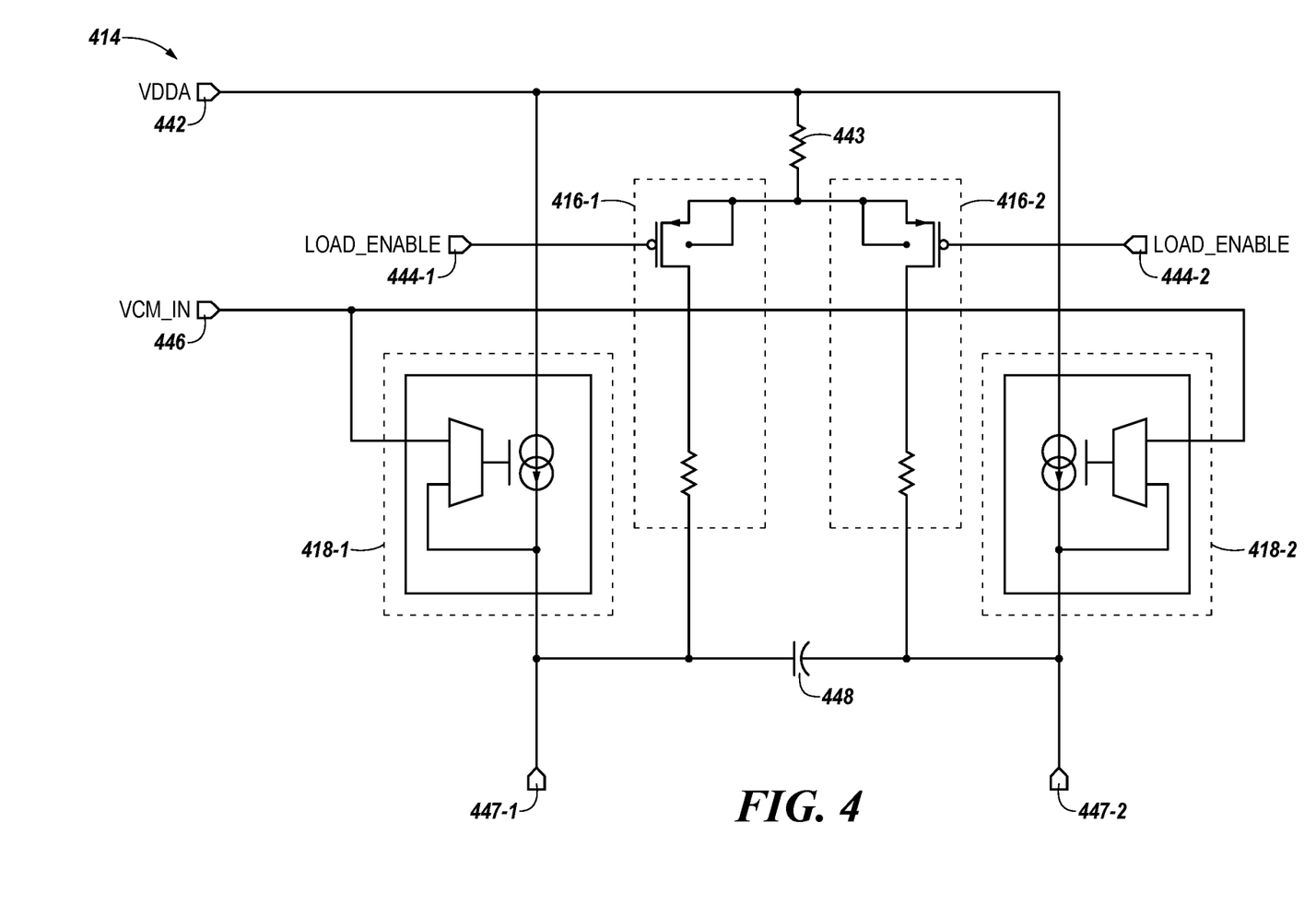
FIG. 4 illustrates another example mixer of a phase interpolator that includes static loads and dynamic loads in accordance with some embodiments of the present disclosure.

FIG. 4 illustrates an example mixer 414 of a phase interpolator (e.g., the phase interpolation component 113 illustrated in FIG. 1) that includes static loads 416-1 and 416-2 (collectively referred to as static loads 416) and dynamic loads 418-1 and 418-2 (collectively referred to as dynamic loads 418) in accordance with some embodiments of the present disclosure. The example mixer 414, the static loads 416, and the dynamic loads 418 shown in FIG. 4 can correspond to the mixer 114, the static load 116, and the dynamic load 118 illustrated in connection with FIG. 1, respectively. In some embodiments, the static loads 416 illustrated in FIG. 4 can be resistive loads.

As illustrated in FIG. 4, the static loads 416 can respectively include a resistor and a transistor. Although embodiments are not so limited, a transistor of each one of the static loads 416 can be a pMOS transistor. The dynamic loads 418 can respectively include an amplifier (e.g., operational transconductance amplifier) and an independent current source (e.g., generator).

As illustrated in FIG. 4, a power supply signal line 442 is coupled to the static loads 416 (via a common-mode resistor 443) and to the dynamic loads 418 such that, during operation of the mixer 414, the static loads 416 and the dynamic loads 418 are configured to receive a power supply signal ("VDDA") via the power supply signal line 442. The static loads 416 are coupled to respective signal lines 444-1 and 444-2 to receive an enable signal ("LOAD_ENABLE") that enables the static loads 416 and/or a disable signal that disables the static loads 416. The dynamic loads 418 are respectively coupled to a signal line 446 to receive a master clock signal ("VCM_IN") (e.g., from the host system 120 illustrated in FIG. 1). As further described herein, the signal lines 444-1, 444-2, and 446 can be used to enable/disable static loads 416 and/or dynamic loads 418, respectively.

As further illustrated in FIG. 4, respective output signal lines of the static loads 416 are coupled to a pair of complementary signal lines 447-1 and 447-2 (collectively referred to as a pair of complementary signal lines 447) in parallel with respective output signal lines of the dynamic loads 418. The pair of complementary signal lines 447 are coupled to one another via a capacitor 248 and to a subsequent stage of a phase interpolator (e.g., the phase interpolation component 113 illustrated in FIG. 1), such as current mode logic (CML)-style circuit and/or state machines including buffers (CML buffers), dividers, flip flops, etc.

Figure 5:
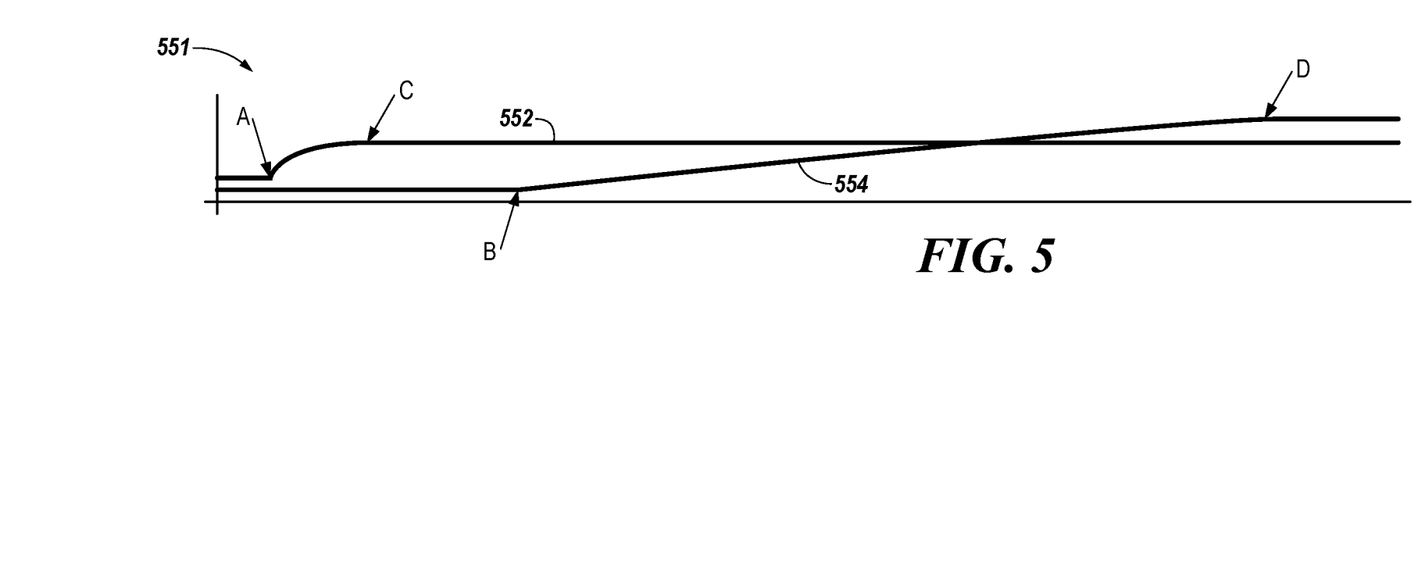
FIG. 5 is a graph illustrating changes in voltage levels of respective input voltages to static loads and dynamic loads of a mixer in accordance with some embodiments of the present disclosure.

FIG. 5 is a graph 551 illustrating changes in voltage levels of respective input voltages to static loads (e.g., the static loads 416 illustrated in FIG. 4) and dynamic loads (e.g., the dynamic loads 418 illustrated in FIG. 4) of a mixer (e.g., the mixer 414 illustrated in FIG. 4) in accordance with some embodiments of the present disclosure. A signal 552 can correspond to a bias voltage applied to the static loads 416 via the signal line 444-1 and 444-2 and a signal 554 can correspond to a signal applied to the dynamic loads 418 via the signal line 446.

The mixer 414 can be operated in a first operation mode, in which only the static loads 416 are enabled, as described herein. To operate the mixer 414 in the first operation mode, the static loads 416 can be enabled by applying a ground voltage (e.g., 0 V and/or a voltage level of the signal 552 up to a point B illustrated in FIG. 5) to a gate of respective transistors of the static loads 416 and the dynamic loads 418 can be disabled by applying a signal corresponding to VSSA (e.g., ground voltage), which leaves only the static loads 416 active in the mixer 414 and cause the mixer 414 to behave as a buffer. The enabled static loads 416 output DC signals.

During the first operation mode, the mixer 414 outputs respective signals having static (e.g., constant) voltage levels. For example, during the first operation mode, a signal coupled to one of the pair of complementary signals 447 can be driven low (e.g., set to "1") and a signal coupled to another one of the pair of complementary signals 447 can be driven high (e.g., set to "0"). In some embodiments, various components of a phase interpolator (e.g., the phase interpolation component 113 illustrated in FIG. 1), such as dividers, can be reset during the first operation mode.

Subsequently, the mixer 414 that has been operated in the first operation mode can be transitioned to operate in a second operation mode, in which only the dynamic loads 418 are enabled, as described herein. To transition operation of the mixer 414 from the first operation mode to the second operation mode, the signal 552 can be ramped up to a particular voltage level (e.g., a voltage level of the signal 552 subsequent to the point C illustrated in FIG. 5) at a controlled rate and can remain constant (e.g., stabilized) thereafter, as illustrated in FIG. 5. By way of example, the signal 552 can be ramped up approximately from 0.1 V to 0.7 V over 0.10 microseconds (us).

The ramped-up signal 552 can enable the dynamic loads 418. Subsequently, from a point B illustrated in FIG. 5, the signal 554 can be ramped up to VDDA at a controlled rate and can remain constant thereafter (e.g., subsequent to a point D illustrated in FIG. 5), which disables the static loads 416 are disabled and eliminate a signal path from the static loads 416. By way of example, the signal 554 can be ramped up approximately from 0 V to 1V over 0.64 us. As described herein, when to start disabling the signal 554 can be determined based on a period of time (e.g., from a starting point of the first operation mode to the point B illustrated in FIG. 5) indicated by a timer. The period of time indicated/counted by the timer can be sufficient to allow the ramping signal 552 to stabilize. As described herein, the mixer 414 can output internal sampling clock signals via the pair of complementary signal lines 447 during the second operation mode and the internal sample clock signals can further be adjusted into fine increments and/or used to generate, for example, quadrature clock signals at a subsequent stage (e.g., state machine such as a divider) of the phase interpolator.

Figure 6:
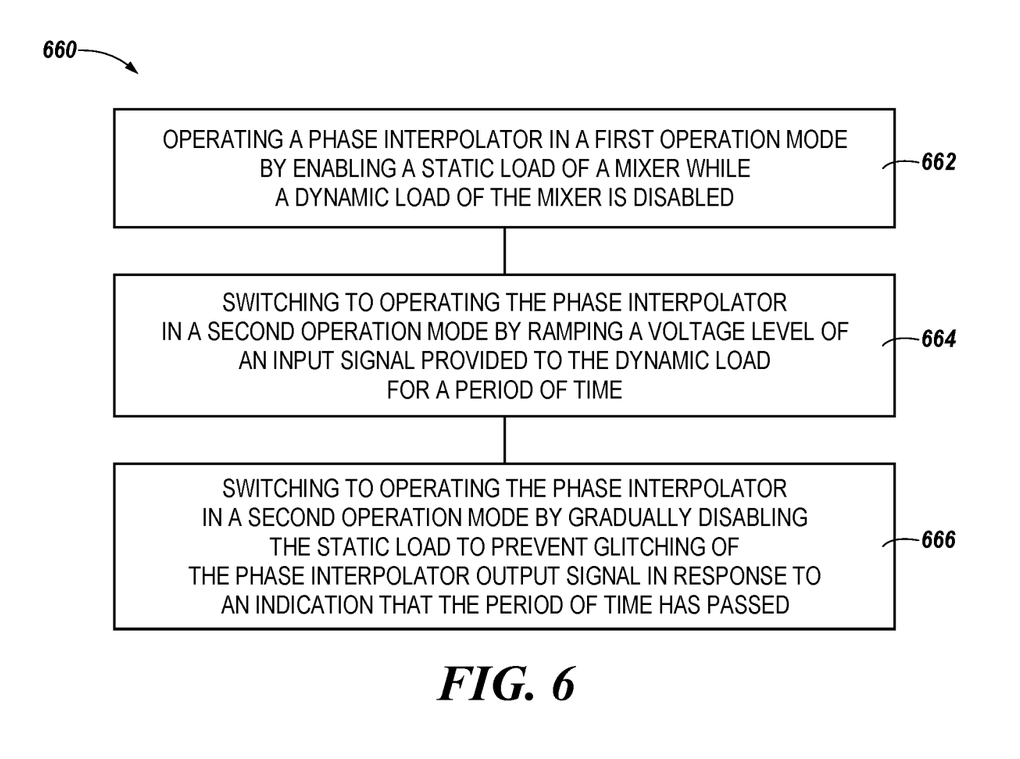
FIG. 6 is a flow diagram corresponding to a method for phase interpolator mode transitions in accordance with some embodiments of the present disclosure.

FIG. 6 is a flow diagram corresponding to a method 660 for phase interpolator for mode transitions in accordance with some embodiments of the present. The method 660 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 660 is performed by the phase interpolation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 662, a mixer (e.g., the mixer 114 illustrated in FIG. 1) of a phase interpolator (e.g., the phase interpolation component 113 illustrated in FIG. 1) can be operated in a first operation mode by enabling a static load (e.g., the static load 116 illustrated in FIG. 1) of the mixer while a dynamic load (e.g., the dynamic load 118 illustrated in FIG. 1) is disabled. In some embodiments, the phase interpolator further can include a divider, which can be reset during the first operation mode.

The first operation mode can be switched to a second operation mode to cause the mixer to operate in the second operation mode. To switch from the first operation mode to the second operation mode, at operation 664, a voltage level of an input signal (e.g., the signal 334 and/or 554 illustrated in FIG. 3 and FIG. 5, respectively) provided to the dynamic load of the mixer can be ramped for a period of time. At operation 666, the static load can be gradually disabled to prevent glitching of the phase interpolator output signal in response to an indication that the period of time has passed. The first operation mode corresponds to a direct current (DC) mode and the second operation mode corresponds to an alternating current (AC) mode. To gradually disable the static load, a voltage level of a control signal applied to the static load can be gradually adjusted.

Figure 7:
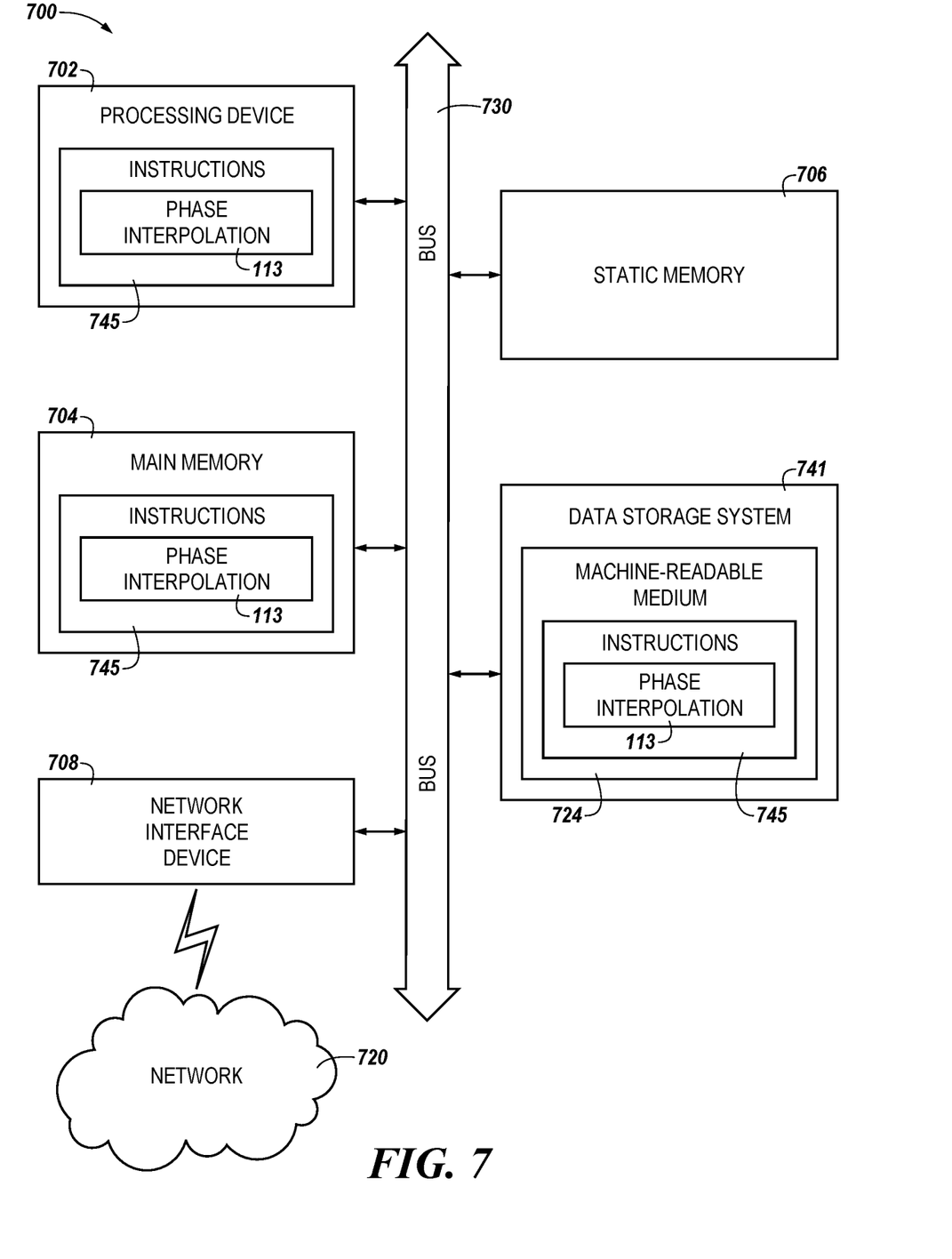
FIG. 7 is a block diagram of an example computer system in which embodiments of the present disclosure may operate.

FIG. 7 is a block diagram of an example computer system 700 in which embodiments of the present disclosure may operate. For example, FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the phase interpolation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 741, which communicate with each other via a bus 730.

The processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 745 or software embodying any one or more of the methodologies or functions described herein. The instructions 745 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 741, and/or main memory 704 can correspond to the memory sub-system 110 of FIG. 1.

In one embodiment, the instructions 745 include instructions to implement functionality corresponding to a phase interpolation component (e.g., the phase interpolation component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A phase interpolator, comprising:
  a dynamic load having an output signal provided to a subsequent stage of the phase interpolator, the dynamic load configured to provide an alternating current (AC) signal to the subsequent stage of the phase interpolator as an input clock signal; and
  a static load having an output signal provided to the subsequent stage of the phase interpolator in parallel with the output signal of the dynamic load, the static load configured to provide a direct current (DC) signal to the phase interpolator temporarily in replacement of the respective AC signals to prevent output signals of the subsequent stage of the phase interpolator from being unpredictable.

2. The phase interpolator of claim 1, wherein the dynamic load is a source follower load, the source follower load further comprising a n-type metal oxide semiconductor (nMOS) transistor.

3. The phase interpolator of claim 1, wherein the static load is a resistive load, the resistive load further comprising a p-type metal oxide semiconductor (pMOS) transistor.

4. The phase interpolator of claim 1, wherein the subsequent stage of the phase interpolator comprises a frequency divider.

5. The phase interpolator of claim 1, wherein:
the dynamic load is one of a pair of dynamic loads that are coupled to the subsequent stage of the phase interpolator; and
the static load is one of a pair of static loads that are coupled to the subsequent stage of the phase interpolator in parallel with the pair of dynamic loads.

6. The phase interpolator of claim 5, wherein the pair of dynamic loads and the pair of static loads are coupled to the subsequent stage of the phase interpolator via a pair of complementary signal lines.

7. The phase interpolator of claim 5, wherein the pair of static loads comprises a pair of resistive loads, and wherein the system further comprises a power supply signal coupled to the pair of resistive loads via a common mode resistor.

8. A system, comprising:
a mixer coupled to a subsequent stage of a phase interpolator, the mixer comprising:
a static load configured to output a direct current (DC) signal; and
a dynamic load configured to output an alternating current (AC) signal; and
a processing device coupled to the phase interpolator, the processing device configured to cause the mixer to:
enable the static load to provide a DC signal to the subsequent stage of the phase interpolator;
while the DC signal is being provided to the phase interpolator, ramp an input signal provided to the dynamic load to cause the dynamic load to output an AC signal; and
subsequent to a voltage level of the input signal being provided to the dynamic load reaching a particular value, gradually adjust a voltage level of an input signal being provided to the static load to disable the static load.

9. The system of claim 8, wherein the subsequent stage of the phase interpolator comprises a plurality of dividers, and wherein a processing resource is configured to cause the phase interpolator to reset the plurality of dividers while the static load is enabled.

10. The system of claim 8, wherein the static load comprises a source follower load, and wherein the source follower load is disabled as the input signal provided to the dynamic load ramps up.

11. The system of claim 8, wherein the static load comprises a resistive load, and wherein the resistive load is disabled as the input signal provided to the resistive load ramps up.

12. The system of claim 11, wherein the resistive load comprises a transistor and the input signal provided to the resistive load is a gate voltage applied to the transistor.

13. The system of claim 8, the processing device is configured to indicate that a voltage level of the input signal has reached the particular value and the output signal of the dynamic load has entered a steady state based on a timer.

14. The system of claim 8, wherein the static load comprises a resistive load, and wherein the processing device is configured to ramp up an input signal provided to the resistive load to disable the resistive load.

15. The system of claim 8, wherein:
the mixer is coupled to the subsequent stage of the phase interpolator via a pair of complementary signal lines; and
the pair of complementary signal lines are coupled to one another via a capacitor.

16. The system of claim 8, wherein the subsequent stage of the phase interpolator comprises a divider, and wherein:
the mixer is configured to provide a pair of differential clock signals; and
the divider is configured to generate quadrature clock signals based on the pair of differential clock signals received from the mixer.

17. A method, comprising:
operating a phase interpolator in a first operation mode by enabling a static load of a mixer while a dynamic load of the mixer is disabled; and
switching to operating the phase interpolator in a second operation mode by:
ramping a voltage level of an input signal provided to the dynamic load for a period of time; and
in response to an indication that the period of time has passed, gradually disabling the static load to prevent glitching of an output signal of the phase interpolator;
wherein the first operation mode corresponds to a direct current (DC) mode and the second operation mode corresponds to an alternating current (AC) mode.

18. The method of claim 17, wherein the phase interpolator is not receiving input clock signals during the first operation mode, and wherein the method includes receiving input clock signals to the phase interpolator prior to switching to operating the phase interpolator is the second operation mode.

19. The method of claim 17, wherein gradually disabling the static load comprises gradually adjusting a voltage level of a control signal applied to the static load.

20. The method of claim 17, wherein the phase interpolator further comprises a divider, and wherein the method further comprises resetting the divider during the first operation mode.

* * * * *